United States Patent
Lee et al.

(10) Patent No.: US 10,922,460 B1
(45) Date of Patent: Feb. 16, 2021

(54) APPARATUS AND METHOD FOR CONSTRUCTING PARAMETERIZED QUANTUM CIRCUIT

(71) Applicant: SAMSUNG SDS CO., LTD., Seoul (KR)

(72) Inventors: Jae Young Lee, Seoul (KR); Ji Won Jung, Seoul (KR)

(73) Assignee: SAMSUNG SDS CO., LTD., Seoul (KR)

( * ) Notice: Subject to any disclaimer, the term of this patent is extended or adjusted under 35 U.S.C. 154(b) by 0 days.

(21) Appl. No.: 16/883,343

(22) Filed: May 26, 2020

(30) Foreign Application Priority Data

May 11, 2020 (KR) .................. 10-2020-0056036

(51) Int. Cl.
*G06F 17/50* (2006.01)
*G06N 10/00* (2019.01)
*G06N 20/00* (2019.01)
*G06F 30/33* (2020.01)
*G06F 30/398* (2020.01)

(52) U.S. Cl.
CPC ............ *G06F 30/33* (2020.01); *G06N 10/00* (2019.01); *G06N 20/00* (2019.01); *G06F 30/398* (2020.01)

(58) Field of Classification Search
CPC ....... G06F 30/33; G06F 30/398; G06N 10/00; G06N 20/00
USPC .................... 716/105, 106, 111, 136; 703/16
See application file for complete search history.

(56) References Cited

U.S. PATENT DOCUMENTS

| 10,325,218 B1 * | 6/2019 | Zeng | ................. G01R 31/3177 |
| 2019/0007051 A1 * | 1/2019 | Sete | ..................... H03K 19/195 |
| 2020/0169396 A1 * | 5/2020 | Neven | ................... G06N 10/00 |

* cited by examiner

*Primary Examiner* — Phallaka Kik
(74) *Attorney, Agent, or Firm* — The PL Law Group, PLLC (57) ABSTRACT

A method for constructing a parameterized quantum circuit according to an embodiment includes inputting learning data to a quantum circuit, receiving output data for the learning data from the quantum circuit and calculating an error rate therefrom, and updating, based on the error rate, parameters for at least one sub-circuit block to be updated among one or more sub-circuit blocks included in the quantum circuit.

17 Claims, 6 Drawing Sheets

| ID | SCB #1 (Layer #1) | SCB #2 (Layer #2) | SCB #3 (Layer #3) | ... | SCB #N (Layer #N) |
|---|---|---|---|---|---|
| Data #1 | 0.12 | 0.09 | 0.07 | ... | TBD |
| Data #2 | 0.35 | 0.27 | 0.21 | ... | TBD |
| Data #3 | 0.001 | 0.001 | - | ... | TBD |
| ⋮ | ⋮ | ⋮ | ⋮ | ⋮ | ⋮ |
| Data #M | 0.25 | - | - | 0.25 | TBD |

APPARATUS AND METHOD FOR CONSTRUCTING PARAMETERIZED QUANTUM CIRCUIT

CROSS REFERENCE TO RELATED APPLICATIONS AND CLAIM OF PRIORITY

This application claims the benefit of Korean Patent Application No. 10-2020-0056036 filed on May 11, 2020 in the Korean Intellectual Property Office, the disclosure of which is incorporated herein by reference in its entirety.

TECHNICAL FIELD

Embodiments disclosed herein relate to a technology for effectively constructing a parameterized quantum circuit.

BACKGROUND ART OF THE INVENTION

Quantum computing refers to a method of processing data utilizing a quantum mechanical phenomenon such as the entanglement or superposition of a quanta. In recent years, a quantum computing technology has entered a technical phase of a level of Noisy Intermediate-Scale Quantum (NISQ). A variety of theoretically tangible quantum algorithms are being developed, but the practical utilization thereof is limited due to limitations of quantum computing hardware.

In order to overcome technical limitations of quantum computing, hybrid quantum-classical computing technologies such as Parameterized Quantum Circuits (PQC) or Variational Quantum Circuits have emerged. Among the above, Parameterized Quantum Circuits refers to a quantum circuit for reducing errors of quantum computing hardware using a parameter. Quantum computing is configured to design a quantum circuit and perform the designed circuit to obtain a desired result. If there are many gate operators used in the circuit, or the depth of the circuit is increased, errors increase. In order to solve the errors, PQC may apply parameters to a quantum circuit and adjust the parameters through learning to adaptively respond to errors of quantum hardware.

A typical parameterized quantum circuit basically performs learning by pre-designing the structure of a circuit to be learned and defining required during an operation. This is similar to pre-defining a model structure in machine learning or deep learning, and learning parameters of a corresponding model. However, in the case of such a typical parameterized quantum circuit, a process of constructing the structure itself of a quantum circuit to be learned is missing. Accordingly, there has been a limit in that the designing of a circuit depends on a person's intuitive or experience.

SUMMARY

Embodiments disclosed herein are to provide technical means for effectively designing a parameterized quantum circuit.

According to an exemplary embodiment, provided is a method for constructing a parameterized quantum circuit, the method being performed in a computing device provided with one or more processors and a memory for storing one or more programs executed by the one or more processors, including the steps of inputting learning data to a quantum circuit, receiving output data for the learning data from the quantum circuit and calculating an error rate therefrom, and updating, based on the error rate, parameters for at least one sub-circuit block to be updated among one or more sub-circuit blocks included in the quantum circuit.

The updating of the parameters may be configured to designate only the most recently added sub-circuit block among the one or more sub-circuit blocks as the sub-circuit block to be updated.

The updating of the parameters may be configured to designate all of the one or more sub-circuit blocks as the sub-circuit block to be updated.

The updating of the parameters may be configured to designate sub-circuit blocks from the most recently added sub-circuit block to a sub-circuit block having a record of the most recent error rate for the learning data as the sub-circuit block to be updated.

The updating of the parameters may be configured to calculate an amount of parameter correction based on the difference between the calculated error rate and the most recent error rate, and distribute the calculated amount to the sub-circuit block to be updated.

The method may further include a step of repeating, by a preset number of times, the steps from the inputting of the learning data to the updating of the parameters.

The method may further include, after performing the step of repeating the steps, a step of performing validation on parameters' learning result of the quantum circuit by inputting validation data to the quantum circuit.

The method may further include a step of adding a new sub-circuit block to the quantum circuit when the validation result shows the error rate of the quantum circuit is lower than an error rate calculated in a previous validating.

The method may further include a step of outputting the quantum circuit as an optimal quantum circuit when the validation result shows the error rate of the quantum circuit is higher than an error rate calculated in a previous validating or when a number of sub-circuit blocks included in the quantum circuit reaches a preset number.

According to another exemplary embodiment, provided is an apparatus for constructing a parameterized quantum circuit, wherein the apparatus includes a learning module for inputting learning data to a quantum circuit, receiving output data for the learning data from the quantum circuit, and calculating an error rate therefrom, and parameter updating module for updating, based on the error rate, parameters for at least one sub-circuit block to be updated among one or more sub-circuit blocks included in the quantum circuit.

The parameter updating module may designate only the most recently added sub-circuit block among the one or more sub-circuit blocks as the sub-circuit block to be updated.

The parameter updating module may designate all of the one or more sub-circuit blocks as the sub-circuit block to be updated.

The parameter updating module may designate sub-circuit blocks from the most recently added sub-circuit block to a sub-circuit block having a record of the most recent error rate for the learning data as the sub-circuit block to be updated.

The parameter updating module may calculate an amount of parameter correction based on the difference between the calculated error rate and the most recent error rate, and distribute the calculated amount to the sub-circuit block to be updated.

The apparatus may further include a validation module for performing validation on parameter-learning result of the quantum circuit by inputting validation data to the quantum circuit when a number of updating the parameters reaches a preset number of times.

The validation module may add a new sub-circuit block to the quantum circuit when the validation result shows the error rate of the quantum circuit is lower than an error rate calculated in a previous validating.

The validation module may output the quantum circuit as an optimal quantum circuit when the validation result shows the error rate of the quantum circuit is higher than an error rate calculated in a previous validating or when a number of sub-circuit blocks included in the quantum circuit reaches a preset number.

According to a disclosed embodiment, an optimal quantum circuit is configured in consideration of the characteristics of a problem to be solved, the number of parameters to be learned, and the complexity of the circuit, so that it is possible to contribute to improving the performance of quantum computing and to increasing the utilization thereof.

DETAILED DESCRIPTION

Hereinafter, specific embodiments of the present invention will be described with reference to the accompanying drawings. The following detailed description is provided to aid in a comprehensive understanding of a method, a device and/or a system described in the present specification. However, the detailed description is only for illustrative purpose and the present invention is not limited thereto.

In describing embodiments of the present invention, when it is determined that detailed descriptions of known technologies relevant to the present invention may unnecessarily obscure the gist of the present invention, the detailed descriptions will be omitted. In addition, the following terms are defined in consideration of the functions of the present invention, and may vary depending on the intention or practice of a user or an operator. Therefore, the definitions of the terms will be made based on the contents throughout the present specification. The terms used in the detailed description are only to describe the embodiments of the present invention embodiments, and should never be limited. Unless clearly used otherwise, the expression of a singular form includes the meaning of a plural form. In this description, expressions such as "inclusive" or "provided" are intended to refer to certain features, numbers, steps, operations, elements, parts or combinations thereof, and should not be construed to preclude the presence or possibility of one or more other features, numbers, steps, operations, elements, or combinations thereof in addition to those described.

Figure 1:
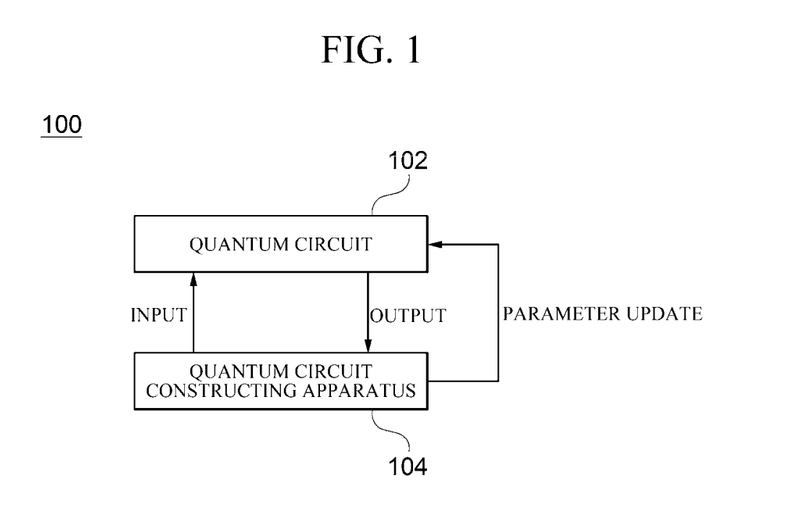
FIG. 1 is a block diagram for describing a parameterized quantum circuit according to an embodiment.

FIG. 1 is a block diagram for describing a parameterized quantum circuit 100 according to an embodiment. As illustrated, the parameterized quantum circuit 100 according to an embodiment includes a quantum circuit 102 and a quantum circuit constructing apparatus 104.

The parameterized quantum circuit 100 is basically driven in a hybrid-quantum-classical manner in which the quantum circuit 102 is constructed and the quantum circuit 102 is learned while updating parameters of the quantum circuit 102 in the quantum circuit constructing apparatus 104. The quantum circuit constructing apparatus 104 sets parameters required for driving the quantum circuit 102. The quantum circuit 102 receives input data from the quantum circuit constructing apparatus 104 and performs an operation therefor. At this time, the result of the operation is affected by the parameter set in the quantum circuit constructing apparatus 104. When output data, which is the operation result for the input data, is received from the quantum circuit 102, the quantum circuit constructing apparatus 104 calculates an error rate, and updates, based on the calculated error rate, parameters set in the quantum circuit 102.

Figure 2:
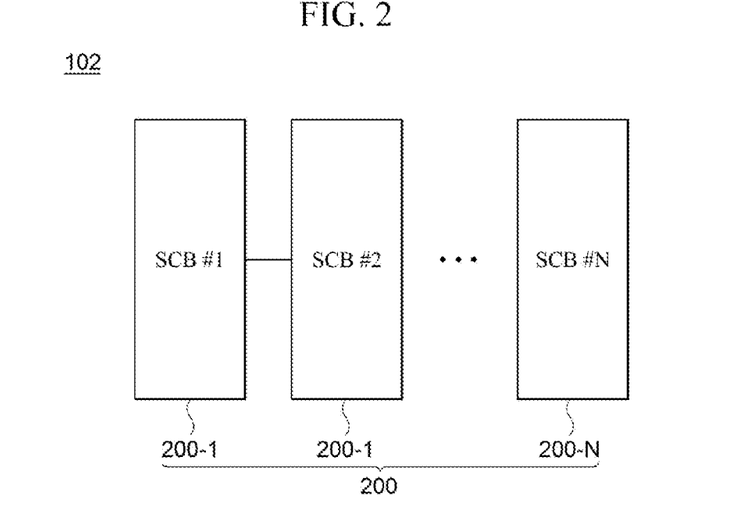
FIG. 2 is a block diagram for describing a quantum circuit according to an embodiment.

FIG. 2 is a block diagram for describing the quantum circuit 102 according to an embodiment. As illustrated, the quantum circuit 102 according to an embodiment includes one or more sub-circuit blocks 200. FIG. 2 shows an embodiment including N sub-circuit blocks 200 from SCB #1(200-1) to SCB #N(200-N).

Each of the sub-circuit blocks 200 has a multi-layered structure in the illustrated quantum circuit 102. In the embodiment of FIG. 2, SCB #1(200-1) becomes a first layer, SCB #2(200-2) becomes a second layer, and SCB #N(200-N) becomes an N-th layer. The sub-circuit blocks 200 of each layer perform an operation on the result of the previous layer and transfer the same to the next layer. For example, in the illustrated quantum circuit 102, a k-th sub-circuit block 200-$k$ is configured to perform an operation of the result of a k−1-th sub-circuit block 200-($k$−1) and transfer the result to a k+1-th sub-circuit block 200-($k$+1). In addition, each of the sub-circuit blocks 200 includes one or more quantum gates, and each of the quantum gates performs a gate operation according to parameters received from the quantum circuit constructing apparatus 104.

When the quantum circuit 102 includes only a small number of sub-circuit blocks 200, the number of learning parameters is reduced, and thus, may deteriorate learning performance. On the other hand, when the number of the sub-circuit blocks 200 included in the quantum circuit 102 is increased, learning performance may be expected to improve. However, the number of learning parameters is also increased, thereby increasing learning time, so that an error rate is also increased due to the nature of a quantum circuit. Therefore, determining an appropriate number of the sub-circuit blocks 200 required for the quantum circuit 102 is an importance task in terms of the performance and efficiency of the quantum circuit.

Figure 3:
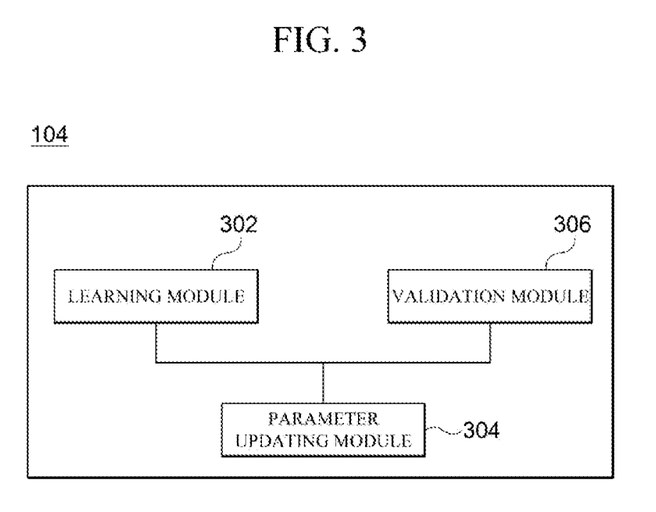
FIG. 3 is a block diagram for describing an apparatus for constructing a quantum circuit according to an embodiment.

FIG. 3 is a block diagram for describing the quantum circuit constructing apparatus 104 according to an embodiment. As illustrated, the quantum circuit constructing apparatus 104 according to an embodiment includes a learning module 203, a parameter updating module 304, and a validation module 306.

The learning module 203 performs learning for the quantum circuit 203 by inputting learning module to the quantum circuit 102. Thereafter, when output data for the learning data is generated from the quantum circuit 102, the learning module 203 receives the same to calculate an error rate. In the embodiments disclosed, the error rate may be a loss rate calculated according to a preset loss function, or a cost calculated according to a cost function.

The parameter updating module 304 updates, according to the error rate calculated in the learning module 203, parameters for at least one sub-circuit block to be updated among one or more sub-circuit blocks 200 included in the quantum circuit 102. In the embodiments disclosed, the parameter updating module 304 basically performs the parameter updating task using a backpropagation method. The backpropagation method is a method for calculating a correction amount based on a loss rate calculated in the last layer of the quantum circuit 102, and dividing and transmitting the calculated correction amount to each layer included in the quantum circuit 102. The sub-circuit blocks 200 of each layer updates their own parameters based on the assigned correction amount. At this time, a method for determining a sub-circuit block to be updated in which parameters are updated may be one of the following three methods.

In the first embodiment, the parameter updating module 304 may designate a sub-circuit block of the last layer, in other words, only a sub-circuit block most recently added to the quantum circuit 102, as the sub-circuit block to be updated. In the above embodiment, the number of parameters to be updated is small, so that the performance rate is high. However, there is a disadvantage in that the effect of learning is insignificant and the reliability according to the addition of the sub-circuit block 200 is poor.

In the second embodiment, the parameter updating module 304 may designate all of the sub-circuit blocks included in the quantum circuit 102 as the sub-circuit block to be updated. In the above embodiment, the number of parameters to be updated is large, so that the performance rate is low. However, there is an advantage in that the performance improvement effect according to learning is significant.

The third embodiment has the advantages of both the first embodiment and the second embodiment. In the above embodiment, the parameter updating module 304 is configured to designate sub-circuit blocks from the most recently added sub-circuit block (the last layer) to a sub-circuit block having a record of the most recent error rate for the learning data as the sub-circuit block to be updated. A block prior to the sub-circuit block having a record of the most recent error rate is not updated. At this time, the reason why sub-circuit blocks having a record of an error rate by learning data is because the recording of an error rate for learning data is performed in a validation step, and validation time may be different according to the learning data. This may be described with an example as follows.

Figure 4:
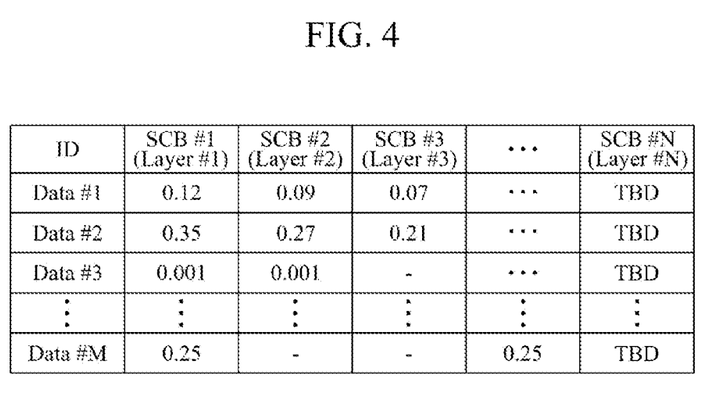
FIG. 4 is an exemplary diagram for describing parameter updating process of each sub-circuit block according to an embodiment.

FIG. 4 is an exemplary diagram for describing parameter updating process of each sub-circuit block according to an embodiment. The illustrated exemplary diagram illustrates a case according to the third embodiment described above.

In the graph of FIG. 4, Data #1, Data #2, . . . , and Data #M mean each learning datum, and each row means an error rate recorded during a validation process using the corresponding learning datum. For example, Data #1 and Data #2 are used as data for validation when each of SCB #1, SCB #2, and SCB #3 is added and has a record of the error rate each thereof. In addition, in the case of Data #3, only the error rate for each of SCB #1 and SCB #2 is recorded, and in Data #M, only the error rate for SCB #1 is recorded.

In the above process, suppose that Data #1 was used as validation data when SCB #N was added. In this case, a sub-circuit block having a record of the most recent error rate becomes SCB #3, so that the parameter updating module 304 updates only the parameters for each of SCB #N to SCB #3, and does not update the parameters for each of SCB #1 and SCB #2. If Data #3dl other than Data #1 is used as the validation data, the parameter updating module 304 updates the parameters for each of SCB #N to SCB #2.

In an embodiment, the parameter updating module 304 is configured to calculate an amount of parameter correction based on the difference between the calculated error rate and the most recent error rate, and distribute the calculated amount to the sub-circuit block to be updated. For example, suppose that Data #1 is used as validation data and the error rate calculated for SCB #N is 0.20. In this case, the most recent error rate is 0.07 calculated in SCB #3. Therefore, the parameter updating module 304 distributes an error rate of 0.13, which is the difference between 0.20 and 0.07, to each sub-circuit block from SCB #N to SCB #3.

Referring back to FIG. 3, when the number of parameter updates by the parameter updating module 304 reaches a preset number of times (K; K is a natural number of 1 or more), the validation module 306 inputs validation data to the quantum circuit 102 to perform validation on parameters' learning result of the quantum circuit 102. At this time, the validation data may be composed of a separate data set from learning data, or a portion of the learning data may be randomly selected and used. A validation result according to the validation may be recorded in a separate storage space as illustrated in FIG. 4 to be used later in parameter updating process.

When the validation is completed, the validation module 306 compares the validation result with the previous result to determine whether there is a performance improvement effect. At this time, whether there is a performance improvement effect may be determined by whether an error rate generated in the validation process is lower than an error rate of the previous step. If the validation result shows that performance is improved, the verification module 306 determines whether the number of the sub-circuit blocks 200 included in the quantum circuit 102 has reached a maximum number, and if not, adds a new sub-circuit block to the quantum circuit 102.

On the other hand, if the validation result shows that performance is not improved (that is, an error rate is higher than that of the previous validation step), the validation module 306 determines that the effect of adding the sub-circuit block 200 is non-existent or insufficient, and outputs the quantum circuit 102 in a current state as an optimal quantum circuit. In the above process, depending on an embodiment, fine-tuning for the parameters of the quantum circuit 102 may be additionally performed. At this time, the fine-tuning may be performed using a backpropagation technique by repeatedly performing parameter updating for all of the sub-circuit blocks 200 until the error rate value of the entire circuit converges. If performance is improved but the number of sub-circuit blocks 200 has reached the maximum number, the validation module 306 does not add the sub-circuit blocks 200.

Figure 5:
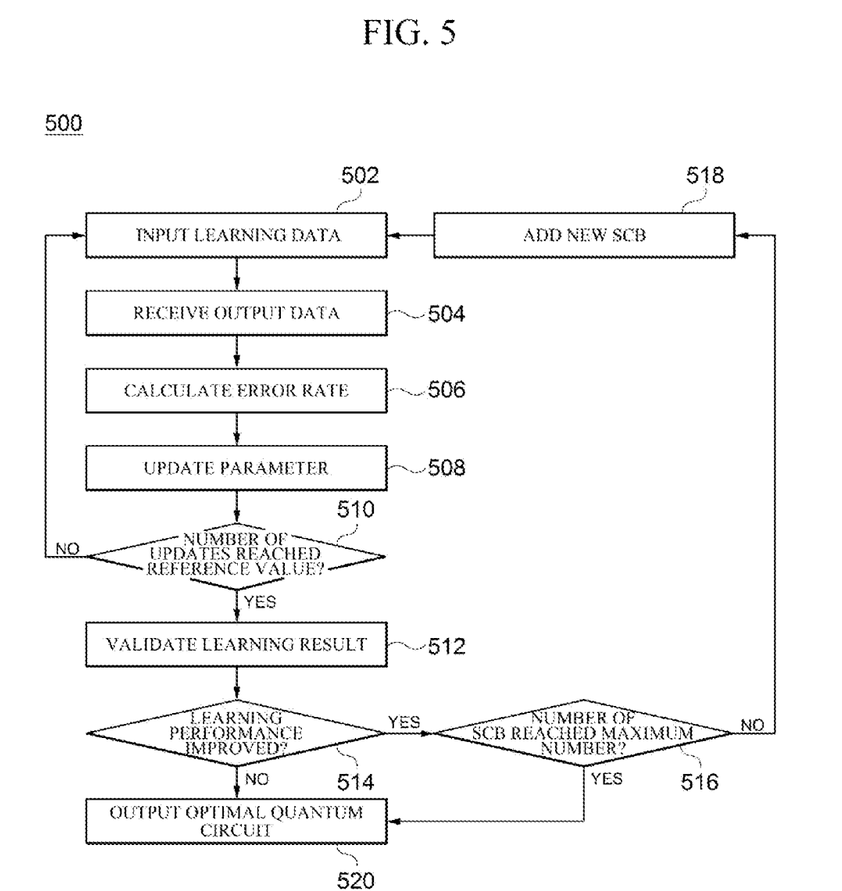
FIG. 5 is a flowchart for describing a method for constructing a quantum circuit according to an embodiment.

FIG. 5 is a flowchart for describing a quantum circuit constructing method 500 according to an embodiment. The illustrated flowchart may be performed by a computing device, for example, the above-described quantum circuit constructing apparatus 104, which is provided with one or more processors and a memory for storing one or more programs executed by the one or more processors. In the illustrated flowchart, the method or process is disclosed by being divided into a plurality of steps. However, at least some of the steps may be performed in a different order, performed by being combined with other steps, omitted, performed by being divided into detailed steps, or performed by being added with one or more steps not illustrated.

In Step 502, the learning module 302 inputs learning data to the quantum circuit 102.

In Step 504, the learning module 302 receives output data for the learning data from the quantum circuit 102.

In Step 506, the learning module 302 calculates an error rate from the output data received in Step 504. In the embodiments disclosed, the error rate may be a loss rate calculated according to a preset loss function, or a cost calculated according to a cost function.

In Step 508, the parameter updating module 304 updates, based on the error rate calculated in the learning module 203, parameters for at least one sub-circuit block to be updated among one or more sub-circuit blocks 200 included in the quantum circuit 102. Details related to the parameter updating have been described above in detail, and thus, repeated descriptions thereof will be omitted.

In Step 510, the validation module 306 determines whether the number of parameters updates by the parameter updating module 304 has reached a preset number of times. When the determination result shows that the number of updates has not reached the preset number of times, the validation module 306 repeatedly performs Steps 502 to 508 through the learning module 302 and the parameter updating module 304 until the preset number of times is reached.

When the determination result shows that the number of updates has reached the preset number of times, the validation module 306 inputs validation data to the quantum circuit 102 in Step 512 to perform validation on quantum circuit's parameters' learning result of the quantum circuit 102.

In Step 514, the validation module 306 compares the validation result with the previous result to determine whether there is a performance improvement effect. At this time, whether there is a performance improvement effect may be determined by whether an error rate generated in the validation process is lower than an error rate of the previous step.

If the validation result shows that performance is improved, the verification module 306 determines whether the number of the sub-circuit blocks 200 included in the quantum circuit 102 has reached a maximum number in Step 516, and if not, adds a new sub-circuit block to the quantum circuit 102 (Step 518).

On the other hand, if the validation result of Step 514 shows that performance is not improved (that is, an error rate is higher than that of the previous validation step), the validation module 306 determines that the effect of adding the sub-circuit block 200 is non-existent or insufficient in Step 520, and outputs the quantum circuit 102 in a current state as an optimal quantum circuit. In the above process, depending on an embodiment, fine-tuning for the parameters of the quantum circuit 102 may be additionally performed. If performance is improved but the validation result of Step 516 shows the number of sub-circuit blocks 200 has reached the maximum number, the validation module 306 does not add the sub-circuit blocks 200.

Figure 6:
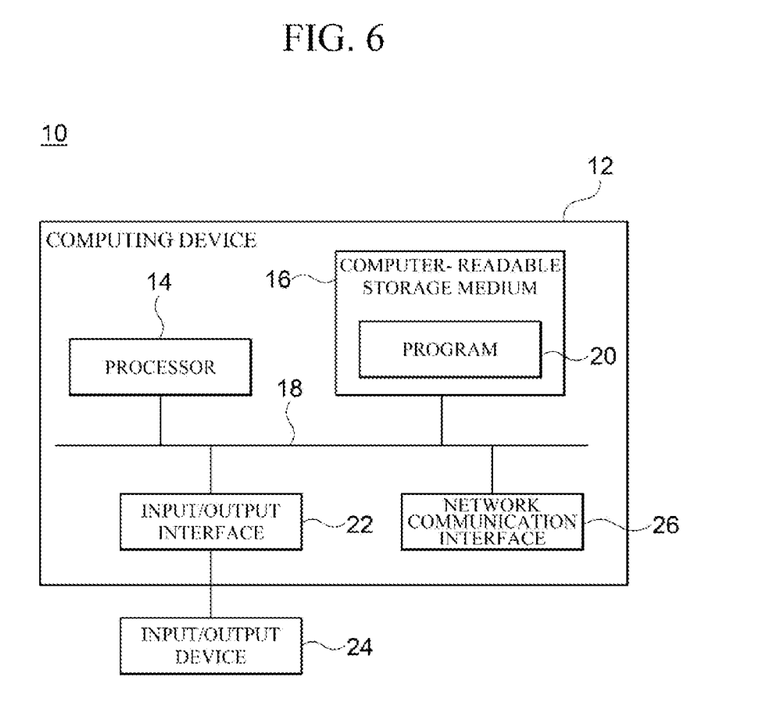
FIG. 6 is a block diagram for describing an example of a computing environment including a computing device suitable for use in exemplary embodiments.

FIG. 6 is a block diagram for describing a computing environment 10 in which a computing device suitable for use in exemplary embodiments is included. In an embodiment illustrated, each component may have a function or ability different from those described below, and an additional component may be included in addition to those described below.

The illustrated computing environment 10 includes a computing device 12. In an embodiment, the computing device 12 may be the quantum circuit constructing device 104 according to embodiments of the present invention. The computing device 12 includes at least one processor 14, a computer-readable storage medium 16 and a communication bus 18. The processor 14 may allow the computing device 12 to operate according to the exemplary embodiment mentioned above. For example, the processor 14 may execute one or more programs stored in the computer-readable storage medium 16. The one or more programs may include one or more computer-executable commands, and when a computer-executable command is executed by the processor 14, the command may be configured to allow the computing device 12 to perform operations according to an exemplary embodiment.

The computer-readable storage medium 16 is configured to store a computer-executable command to a program code, program data, and/or other suitable types of information. A program 20 stored in the computer-readable storage medium 16 includes a set of commands executable by the processor 14. In an embodiment, the computer-readable storage medium 16 may be a memory (a volatile memory such as a random access memory, a non-volatile memory, or a suitable combination thereof), one or more magnetic disk storage devices, optical disk storage devices, flash memory devices, other types of storage media accessed by the computing device 12 and capable of storing desired information, or any suitable combination thereof.

The communication bus 18 includes the processor 14 and the computer-readable storage medium 16 to interconnect various other components of the computing device 12.

The computing device 12 may include one or more input/output interfaces 22 for providing an interface for one or more input/output devices 24 and one or more network communication interfaces 26. The input/output interface 22 and the network communication interface 26 are connected to the communication bus 18. The input/output device 24 may be connected to other components of the computing device 12 through the input/output interface 22. The exemplary input/output devices 24 may include a pointing device (such as a mouse or a track pad), a keyboard, a touch input device (such as a touch pad or a touch screen), a voice or sound input device, an input device such as various sensor devices and/or imaging devices, and/or an output device such as a display device, a printer, a speaker, and/or a network card. The exemplary input/output devices 24 is one component constituting the computing device 12, and may be included inside the computing device 12 or connected to the computing device 12 as a separate device distinct from the computing device 12.

Meanwhile, an embodiment of the present invention may include a program for performing the methods described herein on a computer, and a computer-readable recording medium including the program. The computer-readable recording medium may include, alone or in combination, program instructions, local data files, local data structures, and the like. The medium may be specially designed and configured for the present invention, or may be one commonly used in the field of computer software. Examples of computer-readable recording media include magnetic media such as hard disks, floppy disks, and magnetic tapes, optical recording media such as CD-ROMs and DVDs, and hardware devices specially configured to store and execute program instructions, such as ROMs, RAMs, flash memories, and the like. Examples of the program may include machine codes, such as those created by a compiler, as well as advanced language codes which may be executed by a computer using an interpreter and the like.

Although representative embodiments of the present invention have been described in detail above, those skilled in the art will understand that various modifications for the above-described embodiments are available within the scope of the present invention without departing from the scope of the present invention. Therefore, the scope of the present invention should not be limited to the described embodiments, but should be defined by the following claims as well as the equivalents thereof

The invention claimed is:

1. A method for constructing a parameterized quantum circuit, the method being performed in a computing device including one or more processors and a memory storing one or more programs executed by the one or more processors, the method comprising:
    inputting learning data to a quantum circuit;
    receiving output data for the learning data from the quantum circuit and calculating an error rate from the output data; and
    updating, based on the error rate, parameters for at least one sub-circuit block to be updated among one or more sub-circuit blocks included in the quantum circuit.

2. The method of claim 1, wherein the updating of the parameters is configured to designate only the most recently added sub-circuit block among the one or more sub-circuit blocks as the sub-circuit block to be updated.

3. The method of claim 1, wherein the updating of the parameters is configured to designate all of the one or more sub-circuit blocks as the sub-circuit block to be updated.

4. The method of claim 1, wherein the updating of the parameters is configured to designate sub-circuit blocks from the most recently added sub-circuit block to a sub-circuit block having a record of the most recent error rate for the learning data as the sub-circuit block to be updated.

5. The method of claim 1, wherein the updating of the parameters is configured to calculate an amount of parameter correction based on the difference between the calculated error rate and the most recent error rate, and distribute the calculated amount to the sub-circuit block to be updated.

6. The method of claim 1, further comprising repeating, by a preset number of times, the steps from the inputting of the learning data to the updating of the parameter.

7. The method of claim 6, further comprising, after performing the repeating of the steps, performing validation on parameters' learning result of the quantum circuit by inputting validation data to the quantum circuit.

8. The method of claim 7, further comprising adding a new sub-circuit block to the quantum circuit when the validation result shows the error rate of the quantum circuit is lower than an error rate calculated in a previous validating.

9. The method of claim 7, further comprising outputting the quantum circuit as an optimal quantum circuit when the validation result shows the error rate of the quantum circuit is higher than an error rate calculated in a previous validating or when a number of sub-circuit blocks included in the quantum circuit reaches a preset number.

10. An apparatus for constructing a parameterized quantum circuit, the apparatus comprising:
    a learning module for inputting learning data to a quantum circuit, receiving output data for the learning data from the quantum circuit, and calculating an error rate from the output data; and
    a parameter updating module for updating, based on the error rate, parameters for at least one sub-circuit block to be updated among one or more sub-circuit blocks included in the quantum circuit.

11. The apparatus of claim 10, wherein the parameter updating module designates only the most recently added sub-circuit block among the one or more sub-circuit blocks as the sub-circuit block to be updated.

12. The apparatus of claim 10, wherein the parameter updating module designates all of the one or more sub-circuit blocks as the sub-circuit block to be updated.

13. The apparatus of claim 10, wherein the parameter updating module designates sub-circuit blocks from the most recently added sub-circuit block to a sub-circuit block having a record of the most recent error rate for the learning data as the sub-circuit block to be updated.

14. The apparatus of claim 10, wherein the parameter updating module calculates an amount of parameter correction based on the difference between the calculated error rate and the most recent error rate, and distributes the calculated amount to the sub-circuit block to be updated.

15. The apparatus of claim 10, further comprising a validation module for performing validation on parameters' learning result of the quantum circuit by inputting validation data to the quantum circuit when a number of updating the parameters reaches a preset number of times.

16. The apparatus of claim 15, wherein the validation module adds a new sub-circuit block to the quantum circuit when the validation result shows the error rate of the quantum circuit is lower than an error rate calculated in a previous validating.

17. The apparatus of claim 15, wherein the validation module outputs the quantum circuit as an optimal quantum circuit when the validation result shows the error rate of the quantum circuit is higher than an error rate calculated in a previous validating or when a number of sub-circuit blocks included in the quantum circuit reaches a preset number.

* * * * *